(12) United States Patent
Daitoku et al.

(10) Patent No.: US 11,031,330 B2
(45) Date of Patent: *Jun. 8, 2021

(54) ELECTROCONDUCTIVE SUBSTRATE, ELECTRONIC DEVICE AND DISPLAY DEVICE

(71) Applicant: TDK CORPORATION, Tokyo (JP)

(72) Inventors: Takashi Daitoku, Tokyo (JP); Susumu Taniguchi, Tokyo (JP); Akiko Seki, Tokyo (JP); Atsushi Sato, Tokyo (JP); Yuhei Horikawa, Tokyo (JP); Makoto Orikasa, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/811,018

(22) Filed: Mar. 6, 2020

(65) Prior Publication Data

US 2020/0211951 A1 Jul. 2, 2020

Related U.S. Application Data

(63) Continuation of application No. 16/038,491, filed on Jul. 18, 2018.

(30) Foreign Application Priority Data

Jul. 28, 2017 (JP) .............................. JP2017-146672

(51) Int. Cl.
*H01L 23/498* (2006.01)
*H01L 33/62* (2010.01)
(Continued)

(52) U.S. Cl.
CPC ........ *H01L 23/49838* (2013.01); *G06F 3/044* (2013.01); *H01L 21/4857* (2013.01);
(Continued)

(58) Field of Classification Search
CPC . G06F 2203/04103; G06F 2203/04112; G06F 2203/04111; H05K 2201/09036;
(Continued)

(56) References Cited

U.S. PATENT DOCUMENTS

2002/0051944 A1 5/2002 Takahashi et al.
2005/0006759 A1* 1/2005 Huang .................... H01L 24/05
257/734

(Continued)

FOREIGN PATENT DOCUMENTS

CN 102063951 B 7/2013
JP 2002-134879 A 5/2002
(Continued)

OTHER PUBLICATIONS

Aug. 8, 2019 Office Action issued in U.S. Appl. No. 16/038,491.
Dec. 10, 2019 Office Action Issued in U.S. Appl. No. 16/038,491.

*Primary Examiner* — Alia Sabur
(74) *Attorney, Agent, or Firm* — Oliff PLC

(57) ABSTRACT

An electroconductive substrate, including: a base material; a foundation layer disposed on the base material; a trench formation layer disposed on the foundation layer, and an electroconductive pattern layer including metal plating. A trench including a bottom surface to which the foundation layer is exposed, is formed. The trench is filled with the electroconductive pattern layer. The foundation layer includes a mixed region which is formed from a surface of the foundation layer on the electroconductive pattern layer side towards the inside thereof, and contains metal particles which contain a metal configuring the electroconductive pattern layer, and enter the foundation layer.

13 Claims, 11 Drawing Sheets

(51) Int. Cl.
  *H05K 1/09* (2006.01)
  *H01L 21/48* (2006.01)
  *H05K 3/40* (2006.01)
  *G06F 3/044* (2006.01)

(52) U.S. Cl.
  CPC ........ *H01L 23/49866* (2013.01); *H01L 33/62* (2013.01); *H05K 1/09* (2013.01); *H05K 3/4007* (2013.01); *H01L 2933/0066* (2013.01); *H05K 2201/0338* (2013.01); *H05K 2201/0341* (2013.01); *H05K 2203/04* (2013.01)

(58) Field of Classification Search
  CPC ......... H05K 3/4007; H05K 2201/0236; H05K 2201/09681
  See application file for complete search history.

(56) References Cited

U.S. PATENT DOCUMENTS

| | | | |
|---|---|---|---|
| 2008/0136019 A1* | 6/2008 | Johnson | H01L 24/03 257/737 |
| 2010/0113264 A1* | 5/2010 | Tsurumi | H05K 3/387 502/402 |
| 2012/0074094 A1* | 3/2012 | Chiang | H05K 3/185 216/18 |
| 2014/0218325 A1* | 8/2014 | Iwami | G06F 3/041 345/173 |
| 2015/0000962 A1 | 1/2015 | Gao et al. | |
| 2016/0027973 A1* | 1/2016 | Maki | H01L 33/387 257/99 |
| 2017/0142841 A1* | 5/2017 | Stay | H05K 3/22 |

FOREIGN PATENT DOCUMENTS

| | | | |
|---|---|---|---|
| JP | 2008-174840 A | | 7/2008 |
| JP | 2010-034538 A | | 2/2010 |
| JP | 2015-131421 A | | 7/2015 |
| JP | 2015-148966 A | | 8/2015 |
| JP | 2015148966 A | * | 8/2015 |
| JP | 2016-164694 A | | 9/2016 |
| KP | 10-1642798 | | 7/2016 |
| KR | 10-2017-0024044 A | | 3/2017 |
| WO | 2014/153895 A1 | | 10/2014 |

* cited by examiner

ELECTROCONDUCTIVE SUBSTRATE, ELECTRONIC DEVICE AND DISPLAY DEVICE

This is a Continuation of application Ser. No. 16/038,491 filed Jul. 18, 2018, which claims the benefit of Japanese Patent Application No. JP 2017-146672 filed Jul. 28, 2017. The disclosure of the prior applications is hereby incorporated by reference herein in its entirety.

TECHNICAL FIELD

The present invention relates to an electroconductive substrate, an electronic device, and a display device.

BACKGROUND

There is a case where a transparent antenna provided with an electroconductive substrate having transparency and electroconductivity, is mounted on a surface of a touch panel or a display. Currently, the electroconductive substrate has been required to have high transparency and electroconductivity, and high flexibility, according to an increase in the size and diversification of the touch panel and the display. An electroconductive substrate of the related art, for example, includes an electroconductive pattern layer which is formed of a resin containing ITO, a metal foil, or an electroconductive nanowire, and forms a fine pattern, on a transparent base material.

However, ITO or the electroconductive nanowire is an expensive material. In addition, etching is general as a method of forming a fine electroconductive pattern layer on a base material, but in the method using etching, steps such as an exposing step, a developing step, an etching step, and a peeling step, are necessary, and the number of steps increases. For such a reason, there is a limit to produce an electroconductive substrate at low cost.

In Japanese Unexamined Patent Publication No. 2016-164694, a method is disclosed in which a trench is formed on a transparent base material formed of a resin, the entire surface of the transparent base material is filled with an electroconductive material such as copper according to a vapor deposition method or a sputtering method, the electroconductive material except for that in the trench is removed by etching, and thus, an electroconductive layer is formed, as a method of producing the electroconductive substrate at low cost. On the other hand, in International Publication No. 2014/153895, a method is disclosed in which a trench is formed on a transparent base material formed of a resin, and the trench is filled with an electroconductive material.

SUMMARY

However, in the electroconductive substrate of the related art, including the electroconductive pattern layer filling the trench, the electroconductive layer is peeled off, or electroconductivity decreases, at the time of repeatedly bending the electroconductive substrate.

An object of the present invention is to provide an electroconductive substrate in which an electroconductive pattern layer filling a trench is provided, and the peeling of the electroconductive pattern layer and a decrease in electroconductivity due to bending are suppressed, and an electronic device and a display device, using the electroconductive substrate.

Means for Solving the Problem

According to one aspect of the present invention, an electroconductive substrate, including: a base material; a foundation layer which is disposed on a base material and contains a catalyst; a trench formation layer disposed on the foundation layer; and an electroconductive pattern layer including metal plating, is provided. A trench including a bottom surface to which the foundation layer is exposed, and a lateral surface which includes a surface of the trench formation layer, is formed. The trench is filled with the electroconductive pattern layer. The foundation layer includes a mixed region which is formed from a surface of the foundation layer on the electroconductive pattern layer side towards the inside thereof, and contains metal particles containing a metal configuring the electroconductive pattern layer, and entering the foundation layer.

It is preferable that a ratio of a thickness of the mixed layer to a thickness of the foundation layer is 0.1 to 0.9.

A width of the electroconductive pattern layer may be 0.3 µm to 5.0 µm. A ratio of the thickness of the electroconductive pattern layer to the width of the electroconductive pattern layer may be 0.1 to 10.0.

It is preferable that surface roughness Ra of a surface of the electroconductive pattern layer on a side opposite to the bottom surface of the trench is less than or equal to 100 nm.

It is preferable that a gap is formed between at least a part of a lateral surface of the electroconductive pattern layer and the lateral surface of the trench.

The electroconductive pattern layer may include a blackened surface which configures a surface of the electroconductive pattern layer, including a surface on a side opposite to the bottom surface of the trench. Surface roughness Ra of the blackened surface may be 15 nm to 60 nm.

The electroconductive substrate may further include: a protective film covering at least a part of a surface of the trench formation layer and the electroconductive pattern layer on a side opposite to the base material. It is preferable that a refractive index of the protective film is greater than 1.0, and is less than a refractive index of the trench formation layer.

The electroconductive pattern layer may form a mesh-like pattern.

According to another aspect of the present invention, an electronic device, including: the electroconductive substrate described above; and an electronic component mounted on the electroconductive substrate, is provided.

According to still another aspect of the present invention, a display device, including: the electroconductive substrate described above; and a light emitting element mounted on the electroconductive substrate, is provided.

The electronic device or the display device, may further include: a connection portion disposed on the electroconductive pattern layer of the electroconductive substrate, and the light emitting element may be connected to the electroconductive substrate through the connection portion.

The electronic device or the display device, may further include: an adhesion layer disposed on the electroconductive pattern layer of the electroconductive substrate; an insulating layer which is disposed on the trench formation layer and the adhesion layer, covers a surface of the trench formation layer on a side opposite to the foundation layer, and includes an opening portion to which a part of the adhesion layer is exposed; a UBM layer disposed on a surface of the adhesion layer which is exposed into the opening portion of the adhesion layer, and a connection portion disposed on the UBM layer, and the light emitting element may be connected to the electroconductive substrate through the connection portion, the UBM layer, and the adhesion layer.

DETAILED DESCRIPTION

Hereinafter, embodiments of the present invention will be described with suitable reference to the drawings. Here, the present invention is not limited to the following embodiments.

Figure 1:
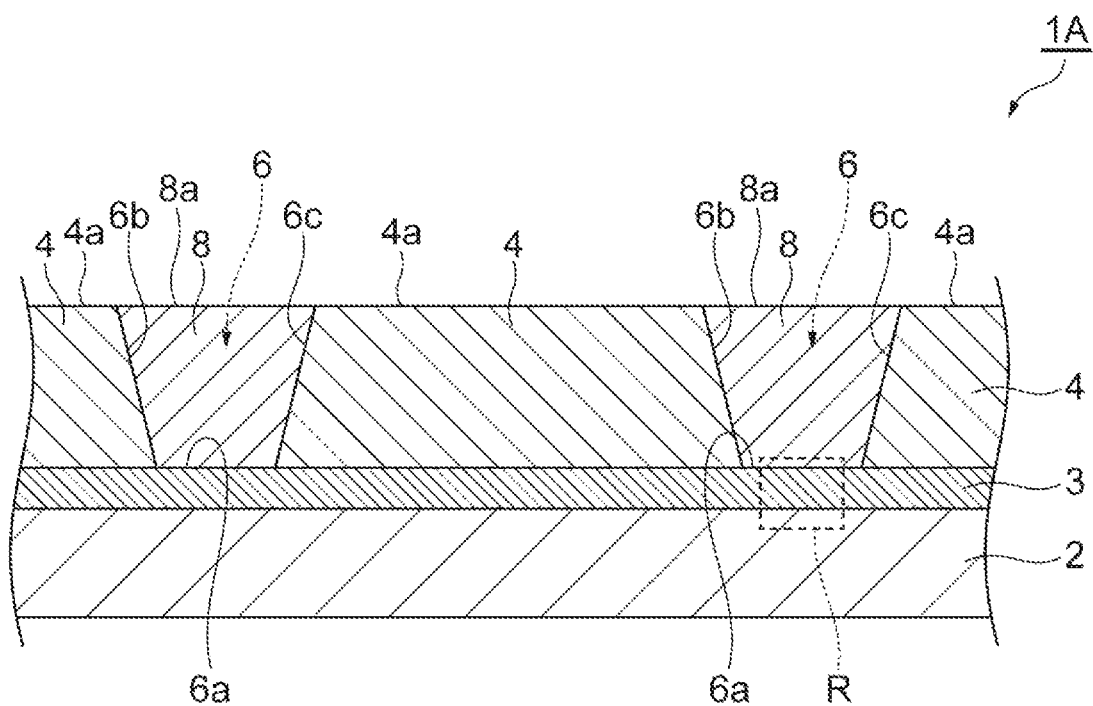
FIG. 1 is a schematic sectional view illustrating an electroconductive substrate according to one embodiment.

FIG. 1 is a schematic sectional view illustrating an electroconductive substrate according to one embodiment. An electroconductive substrate 1A illustrated in FIG. 1, includes a film-like base material 2, a foundation layer 3 disposed on the base material 2, a trench formation layer 4 disposed on a surface of the foundation layer 3 on a side opposite to the base material 2, and an electroconductive pattern layer 8. A trench 6 including a bottom surface 6a to which the foundation layer 3 is exposed, and lateral surfaces 6b and 6c which include a surface of the trench formation layer 4, is formed, and the trench 6 is filled with the electroconductive pattern layer 8.

It is preferable that the base material 2 is a transparent base material, in particular, is a transparent resin film. The transparent resin film, for example, may be a film of polyethylene terephthalate (PET), polycarbonate (PC), polyethylene naphthalate (PEN), a cycloolefin polymer (COP), or a polyimide (PI). Alternatively, the base material 2 may be a glass substrate, an Si wafer, or the like.

The thickness of the base material 2 may be greater than or equal to 10 μm, may be greater than or equal to 20 μm, or may be greater than or equal to 35 μm, and may be less than or equal to 500 μm, may be less than or equal to 200 μm, or may be less than or equal to 100 μm.

The foundation layer 3 contains a catalyst and a resin. The resin may be a curable resin, and examples thereof include an amino resin, a cyanate resin, an isocyanate resin, a polyimide resin, an epoxy resin, an oxetane resin, polyester, an allyl resin, a phenolic resin, a benzooxazine resin, a xylene resin, a ketone resin, a furan resin, a COPNA resin, a silicon resin, a dicyclopentadiene resin, a benzocyclobutene resin, an episulfide resin, an ene-thiol resin, a polyazomethine resin, a polyvinyl benzyl ether compound, acenaphthylene, and a ultraviolet ray curable resin having an unsaturated double bond, or a functional group causing a polymerization reaction by an ultraviolet ray, such as cyclic ether and vinyl ether, and the like.

It is preferable that the catalyst contained in the foundation layer 3 is an electroless plating catalyst. The electroless plating catalyst may be a metal selected from Pd, Cu, Ni, Co, Au, Ag, Pd, Rh, Pt, In, and Sn, and Pd is preferable. Only one type of the metal may be independently used, or a combination of two or more types thereof may be used, as the catalyst. In general, the catalyst is dispersed in the resin, as catalyst particles.

The content of the catalyst in the foundation layer 3, may be greater than or equal to 3 mass %, may be greater than or equal to 4 mass %, or may be greater than or equal to 5 mass %, and may be less than or equal to 50 mass %, may be less than or equal to 40 mass %, or may be less than or equal to 25 mass %, on the basis of the total amount of the foundation layer.

The thickness of the foundation layer 3, may be greater than or equal to 10 nm, may be greater than or equal to 20 nm, or may be greater than or equal to 30 nm, and may be less than or equal to 500 nm, may be less than or equal to 300 nm, or may be less than or equal to 150 nm.

It is preferable that the trench formation layer 4 is a transparent resin layer. In addition, the trench formation layer 4 may be a layer containing an uncured photocurable or thermosetting resin. Examples of the photocurable resin and the thermosetting resin configuring the trench formation layer 4, include an acrylic resin, an amino resin, a cyanate resin, an isocyanate resin, a polyimide resin, an epoxy resin, an oxetane resin, polyester, an allyl resin, a phenolic resin, a benzooxazine resin, a xylene resin, a ketone resin, a furan resin, a COPNA resin, a silicon resin, a dicyclopentadiene resin, a benzocyclobutene resin, an episulfide resin, an ene-thiol resin, a polyazomethine resin, a polyvinyl benzyl ether compound, acenaphthylene, and an ultraviolet ray curable resin having an unsaturated double bond, or a functional group causing a polymerization reaction by an ultraviolet ray, such as cyclic ether and vinyl ether, and the like.

It is preferable that a refractive index (nd25) of the trench formation layer 4 is less than a refractive index of the foundation layer 3, from the viewpoint of increasing the transparency of the electroconductive substrate, and for example, may be greater than or equal to 1.0, and may be less than or equal to 1.7, may be less than or equal to 1.6, or may be less than or equal to 1.5. The refractive index can be measured by a reflecting spectrographic film thickness meter.

The trench 6 includes the bottom surface 6a to which the foundation layer 3 is exposed, and the facing lateral surfaces 6b and 6c which include the surface of the trench formation layer 4 surrounding the bottom surface 6a. The trench 6 extends on the foundation layer 3, such that a pattern corresponding to the electroconductive pattern layer 8 is formed. As illustrated in FIG. 1, the lateral surfaces 6b and 6c may be inclined with respect to the bottom surface 6a such that the width of the trench 6 is narrowed from a surface 4*a* of the trench formation layer 4 on a side opposite to the foundation layer 3 towards the bottom surface 6*a*, or the lateral surfaces 6*b* and 6*c* may be perpendicular to the bottom surface 6*a*. The lateral surfaces 6*b* and 6*c* may form a step.

In general, the width and the depth of the trench 6 are respectively set to be substantially coincident with the width and the thickness of the electroconductive pattern layer 8. Herein, the width of the trench indicates the maximum width in a direction perpendicular to a direction in which the trench extends. A ratio of the depth of the trench to the width of the trench, may be identical to an aspect ratio of the electroconductive pattern layer described below.

The electroconductive pattern layer 8 may be a layer formed of single metal plating, or may be configured of a plurality of metal platings having different metals. For example, the electroconductive pattern layer 8 may include a seed layer which is metal plating formed on the foundation layer 3, and one or more upper metal plating layers which are metal plating formed on a surface of the seed layer on a side opposite to the foundation layer 3.

The metal plating as the electroconductive pattern layer 8, for example, contains at least one type of metal selected from copper, nickel, cobalt, palladium, silver, gold, platinum, and tin, and preferably contains copper. The electroconductive pattern layer 8 may further contain a non-metal element such as phosphorus, within a range where suitable electroconductivity is maintained.

In a case where the electroconductive pattern layer 8 includes the seed layer and the upper metal plating layer, a metal configuring the seed layer and a metal configuring the upper metal plating layer may be identical to each other, or may be different from each other, and for example, the seed layer may contain nickel, and the upper metal plating layer may contain copper. The upper metal plating layer may include a copper plating layer formed on the seed layer, and an uppermost layer formed on the copper plating layer, containing gold or palladium.

The electroconductive pattern layer 8 extends on the foundation layer 3 such that a pattern corresponding to the trench 6 is formed. The thickness of the electroconductive pattern layer 8 may be substantially coincident with the thickness of the trench formation layer 4, and a ratio of the thickness of the electroconductive pattern layer 8 to the thickness of the trench formation layer 4 may be within a range of 0.8 to 1.2.

The width of the electroconductive pattern layer 8, may be greater than or equal to 1 μm, may be greater than or equal to 10 μm, or may be greater than or equal to 20 pin, and may be less than or equal to 90 μm, may be less than or equal to 70 μm, or may be less than or equal to 30 μm. Herein, the width of the electroconductive pattern layer indicates the maximum width in a direction perpendicular to an extending direction of the electroconductive pattern layer.

The width of the electroconductive pattern layer 8, may be greater than or equal to 0.3 μm, may be greater than or equal to 0.5 μm, or may be greater than or equal to 1.0 μm, and may be less than or equal to 5.0 μm, may be less than or equal to 4.0 μm, or may be less than or equal to 3.0 μm, from the viewpoint of improving the transparency of the electroconductive substrate.

The thickness of the electroconductive pattern layer 8, may be greater than or equal to 0.1 μm, may be greater than or equal to 1.0 μm, or may be greater than or equal to 2.0 μm, and may be less than or equal to 10.0 μm, may be less than or equal to 5.0 μm, or may be less than or equal to 3.0 μm.

The width and the thickness of the electroconductive pattern layer 8 can be adjusted by changing the design of a mold 7 described below, and by changing the width and the thickness of the trench 6.

An aspect ratio of the electroconductive pattern layer 8, may be greater than or equal to 0.1, may be greater than or equal to 0.5, or may be greater than or equal to 1.0, and may be less than or equal to 10.0, may be less than or equal to 7.0, or may be less than or equal to 4.0. By setting the aspect ratio of the electroconductive pattern layer 8 to be in the range described above, it is possible to further increase the adhesiveness of the electroconductive pattern layer 8 with respect to the foundation layer 3, and to further increase the electroconductivity. The aspect ratio of the electroconductive pattern layer indicates a ratio of the thickness of the electroconductive pattern layer to the width of the electroconductive pattern layer (Thickness/Width).

The electroconductive pattern layer 8, for example, may include a plurality of linear portions arranged while extending along a certain direction, and may be formed into the shape of a mesh.

Figure 2:
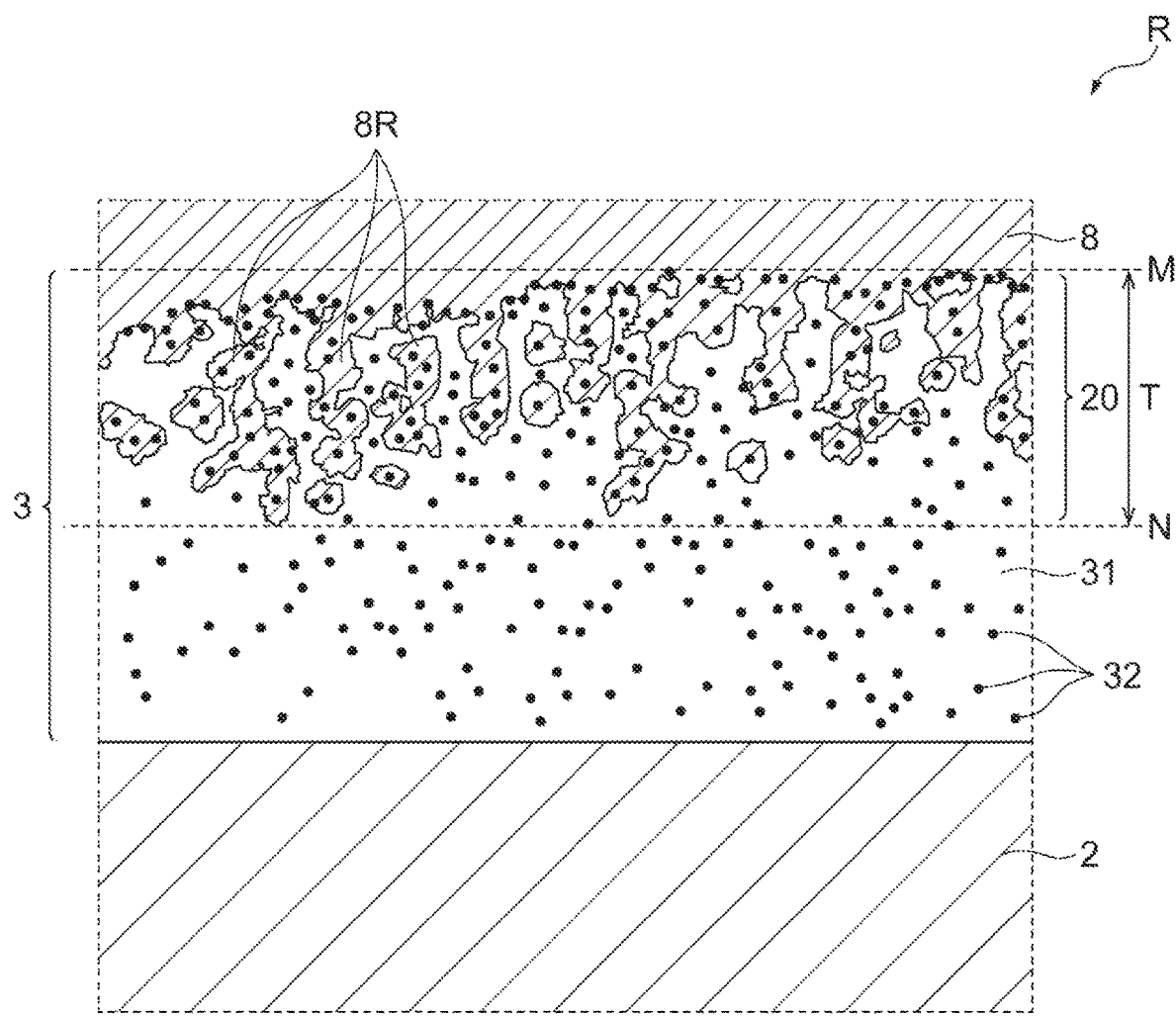
FIG. 2 is a partially enlarged view of the electroconductive substrate illustrated in FIG. 1.

FIG. 2 is an enlarged view of a region R, in the sectional view of the electroconductive substrate 1 illustrated in FIG. 1. As illustrated in FIG. 2, the foundation layer 3 includes a mixed region 20 which is formed from a surface of the foundation layer 3 on the electroconductive pattern layer 8 side (or an upper boundary M) to the inside thereof, and containing a plurality of metal particles 8R which contain a metal configuring the electroconductive pattern layer 8 and entering the foundation layer 3. The mixed region 20 contains the metal particles 8R, and a resin 31 and catalyst particles 32, which are main components of the foundation layer 3. In general, the metal particles 8R include metal plating grown starting from the catalyst particles 32. For this reason, there are many cases where the catalyst particles 32 are incorporated into the metal particles 8R. It is preferable that at least a part of the plurality of metal particles 8R is continuously connected from the electroconductive pattern layer 8 to the mixed region 20. It is possible to confirm that the mixed region 20 is formed, for example, by performing observation with an electron scanning microscope.

A thickness T of the mixed region 20 is preferably greater than or equal to 1 nm, is more preferably greater than or equal to 5 nm, and is even more preferably greater than or equal to 10 nm, and is preferably less than or equal to 500 nm, is more preferably less than or equal to 300 nm, is even more preferably less than or equal to 200 nm, and is particularly preferably less than or equal to 100 nm, from the viewpoint of further increase the adhesiveness of the electroconductive substrate 1.

Here, the thickness T of the mixed region 20 is defined as a distance from the upper boundary M on the electroconductive pattern layer 8 side to a lower boundary N on the base material 2 side. Each of the upper boundary M and the lower boundary N is a sectional surface in a direction perpendicular to a thickness direction of the electroconductive substrate 1 (hereinafter, referred to as a "horizontal plane"). The upper boundary M is positioned to be closest to the electroconductive pattern layer side, in a horizontal plane containing the resin 31 configuring the foundation layer 3. The lower boundary N is positioned to be closest to the base material 2 side, in a horizontal plane containing the metal particles 8R. The upper boundary M and the lower boundary N can be determined by observing a sectional surface along the thickness direction of the electroconductive substrate 1A (hereinafter, referred to as a "perpendicular plane") with an electron scanning microscope or the like. The thickness T of the mixed region may be obtained by observing a plurality of perpendicular planes, and the average value thereof may be considered as the thickness T of the mixed region 20 of the electroconductive substrate 1. The mixed region is formed, and thus, the electroconductive pattern layer 8 can be effectively prevented from being peeled off from the foundation layer 3.

A ratio of the thickness T of the mixed region 20 to the thickness of the foundation layer 3 is preferably greater than or equal to 0.1, is more preferably greater than or equal to 0.2, and is even more preferably greater than or equal to 0.3, and is preferably less than or equal to 0.9, is more preferably less than or equal to 0.6, and is even more preferably less than or equal to 0.5.

Surface roughness Ra of a surface 8a of the electroconductive pattern layer 8 on a side opposite to the bottom surface 6a of the trench 6 is preferably less than or equal to 100 nm, is more preferably less than or equal to 70 nm, and is even more preferably less than or equal to 30 nm. In a case where the surface roughness Ra of the surface 8a of the electroconductive pattern layer 8 is less than or equal to 100 nm, it is possible to decrease a loss in a skin effect. The lower limit value of the surface roughness Ra is not particularly limited, and for example, is greater than or equal to 5 nm. A lateral surface of the electroconductive pattern layer 8 may have surface roughness Ra within the numerical range described above.

A gap may be formed between at least a part of the lateral surface of the electroconductive pattern layer 8 and the lateral surfaces 6b and/or 6c of the trench 6. Accordingly, it is possible to more effectively suppress a damage on the electroconductive pattern layer 8 if the electroconductive substrate 1A is bent. It is preferable that the gap is formed between the lateral surface of the electroconductive pattern layer 8 and both of facing lateral surfaces 6b and 6c of the trench 6. The width of the gap, may be greater than or equal to 1 nm, may be greater than or equal to 5 nm, or may be greater than or equal to 10 nm, and may be less than or equal to 150 nm, may be less than or equal to 125 nm, or may be less than or equal to 100 nm. The width of the gap indicates the maximum value of a distance between the electroconductive pattern layer 8 and the trench 6, in a direction perpendicular to an extending direction of the electroconductive pattern layer 8. As described below, it is possible to easily form the gap between the electroconductive pattern layer 8 and the lateral surfaces 6b and 6c of the trench, by growing the metal plating from the foundation layer 3, or the seed layer on the foundation layer 3.

Figure 3A:
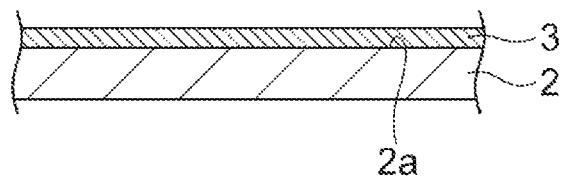
FIGS. 3A to 3E are sectional views schematically illustrating a method of producing the electroconductive substrate illustrated in FIG. 1.

FIGS. 3A to 3E are sectional views schematically illustrating one embodiment of the method of producing the electroconductive substrate 1A illustrated in FIG. 1. In the method according to this embodiment, first, as illustrated in FIG. 3A, the foundation layer 3 containing a catalyst is formed on one main surface 2a of the film-like base material 2. A step of FIG. 3A may be a step of preparing a laminated body including the base material 2, and the foundation layer 3 formed on the base material 2.

Figure 3B:
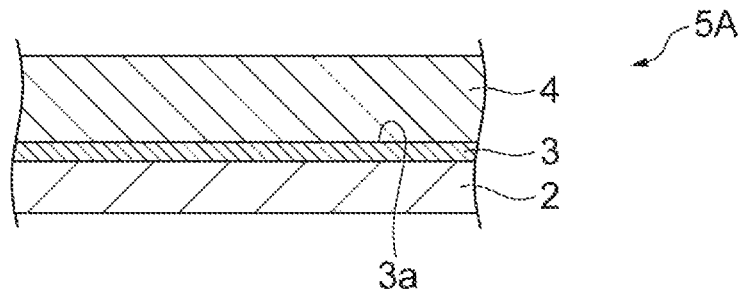

Subsequently, as illustrated in FIG. 3B, the trench formation layer 4 is formed on a surface 3a of the foundation layer 3 on a side opposite to the base material 2. A step of FIG. 3B may be a step of preparing a laminated body 5A including the base material 2, the foundation layer 3, and the trench formation layer 4 in this order.

Figure 3C:
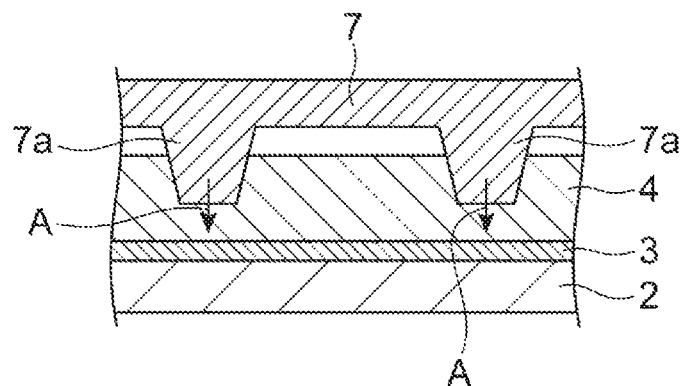
Figure 3D:
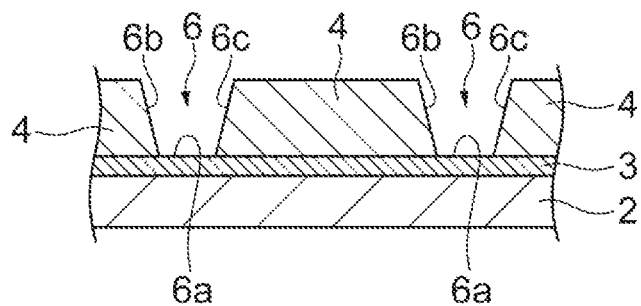

Next, as illustrated in FIG. 3C and FIG. 3D, the trench (a groove portion) 6 is formed according to an imprint method using the mold 7 including a convex portion 7a. In this step, the mold 7 including the convex portion 7a having a predetermined shape, is moved in a direction illustrated by an arrow A, and thus, is pushed into the trench formation layer 4 (FIG. 3C). The mold 7 may be pushed until a tip end of the convex portion 7a reaches the foundation layer 3. In this state, in a case where the trench formation layer 4 is a layer containing an uncured photocurable or thermosetting resin, the trench formation layer 4 is cured. In a case where the trench formation layer 4 is a layer containing a photocurable resin, the trench formation layer 4 is cured by being irradiated with light such as an ultraviolet ray. After that, the mold 7 is detached, and thus, the trench 6 having a shape on which the shape of the convex portion 7a of the mold 7 is reflected, is formed (FIG. 3D). A method of forming the trench 6 is not limited to the imprint method, and for example, the trench 6 may be formed by a laser, dry etching, or photolithography.

As illustrated in FIG. 3D, the trench 6 includes the bottom surface 6a to which the foundation layer 3 is exposed, and the facing lateral surfaces 6b and 6c which include the surface of the trench formation layer 4 surrounding the bottom surface 6a. The trench 6 extends on the foundation layer 3 such that a pattern corresponding to the electroconductive pattern layer 8 is formed. In order to expose the foundation layer 3 to the bottom surface 6a of the trench 6, the trench formation layer 4 remaining on the foundation layer 3 in the trench 6 may be removed by etching such as dry etching, after the mold 7 is detached.

The mold 7 may be formed of quartz, Ni, ultraviolet ray curable liquid silicone rubber (PDMS), and the like. The shape of the convex portion 7a of the mold 7 is designed according to the shape of the trench 6 to be formed.

Figure 3E:
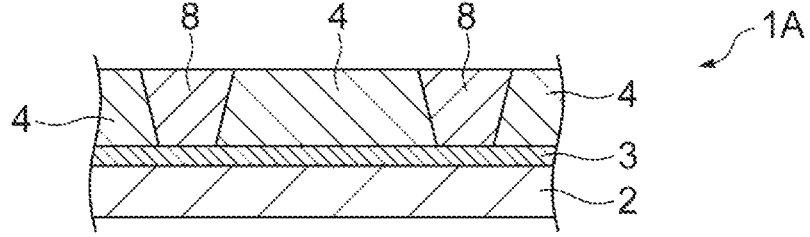

Next, as illustrated in FIG. 3E, the electroconductive pattern layer 8 filling the trench 6, is formed. The electroconductive pattern layer 8 may be formed by an electroless plating method of growing the metal plating from the foundation layer 3. The laminated body 5A in which the trench 6 is formed, is dipped in an electroless plating liquid containing a metal ion, and thus, metal plating as the electroconductive pattern layer 8 can be formed starting from the catalyst contained in the foundation layer 3. The electroconductive pattern layer 8 filling the trench 6 is formed, and thus, the electroconductive substrate 1A can be obtained.

The electroless plating liquid contains the ion of the metal configuring the electroconductive pattern layer. The electroless plating liquid may further contain phosphorus, boron, iron, and the like.

The temperature of the electroless plating liquid at the time of dipping the laminated body 5A in the electroless plating liquid, for example, may be 40° C. to 90° C. In addition, a dipping time of the electroless plating liquid is different according to the thickness of the electroconductive pattern layer 8, and for example, 10 minutes to 30 minutes.

The electroconductive pattern layer including the seed layer and the upper metal plating layer, can be formed by a method including forming the seed layer on the foundation layer, and forming the upper metal plating layer on the seed layer. The laminated body 5A in which the trench 6 is formed, is dipped in the electroless plating liquid for forming the seed layer, and thus, the metal plating is formed starting from the catalyst contained in the foundation layer 3, as the seed layer. After that, the laminated body including the seed layer is dipped in the electroless plating liquid for forming an electroconductive layer, and thus, the upper metal plating layer can be formed. The catalyst may be adsorbed in the seed layer before the upper metal plating layer is formed, and the upper metal plating layer may be formed starting from the catalyst adsorbed in the seed layer.

The thickness of the seed layer, may be greater than or equal to 10 nm, may be greater than or equal to 30 nm, or may be greater than or equal to 50 nm, and may be less than or equal to 500 nm, may be less than or equal to 300 nm, or may be less than or equal to 100 nm.

Figure 4A:
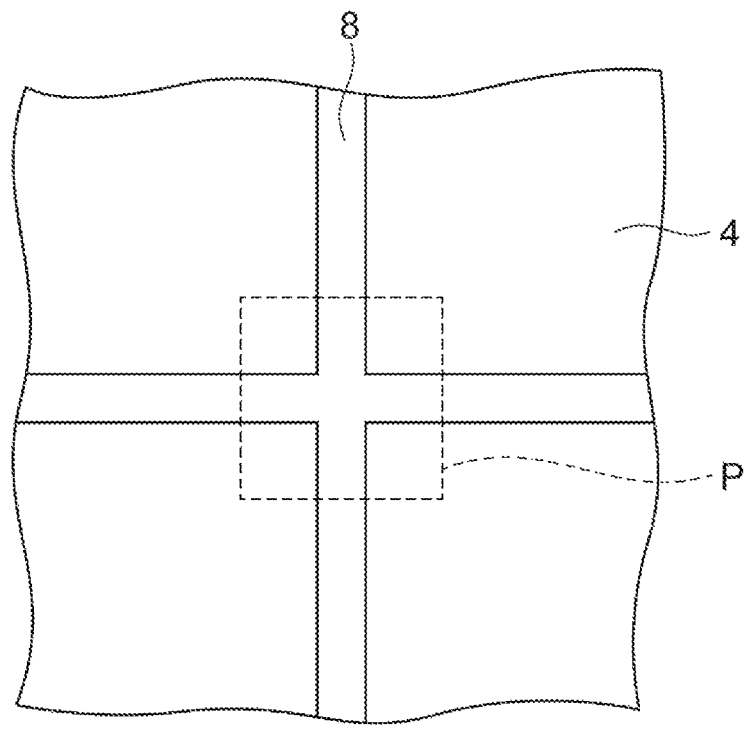
FIG. 4A is a partially enlarged view illustrating the electroconductive substrate according to one embodiment.
Figure 4B:
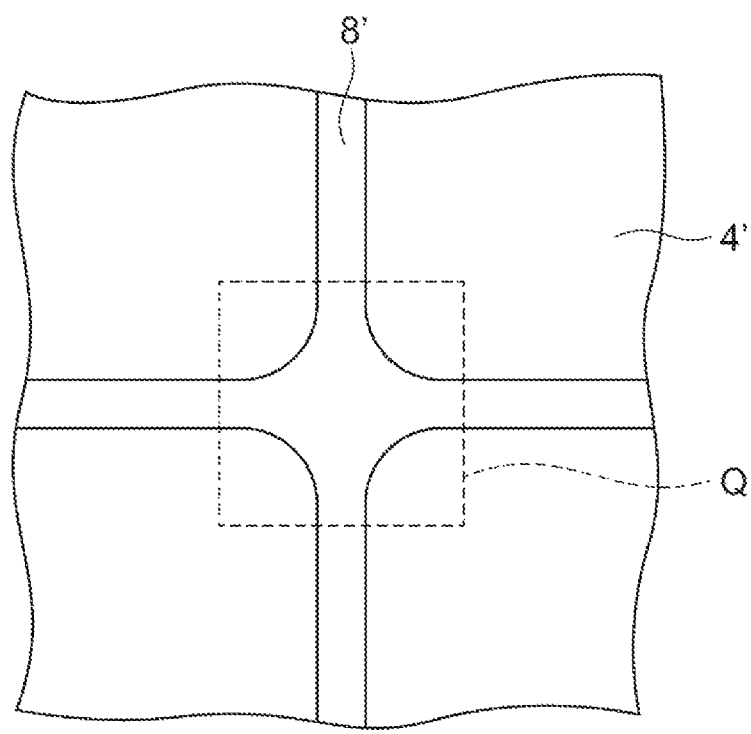
FIG. 4B is a partially enlarged view illustrating an example of an electroconductive substrate of the related art.

The method according to this embodiment is excellent from the viewpoint of enabling the electroconductive pattern layer having a constant width to be easily formed. FIGS. 4A and 4B are partially enlarged views illustrating an example of the electroconductive substrate including the electroconductive pattern layer forming a mesh-like pattern. In a case of the electroconductive substrate which is formed by the method according to this embodiment, as exemplified in FIG. 4A, the width of the electroconductive pattern layer 8 is not greatly changed even in a region P in the vicinity of an intersection between two electroconductive pattern layers 8, and a constant width is easily maintained. In contrast, in a case of a method of the related art in which the electroconductive pattern layer is formed by etching, as exemplified in FIG. 4B, there is a case where the width of the electroconductive pattern layer 8' increases in a region Q in the vicinity of an intersection between two electroconductive pattern layers 8'. The fact that a variation in the width of the electroconductive pattern layer is small, and the fact that the width of the electroconductive pattern layer 8 does not increase in the region in the vicinity of the intersection, are advantageous from the viewpoint of increasing a total light transmittance, and the fact that a variation in the width of the electroconductive pattern layer 8 is small, is advantageous from the viewpoint of decreasing a variation in the total light transmittance.

Figure 5:
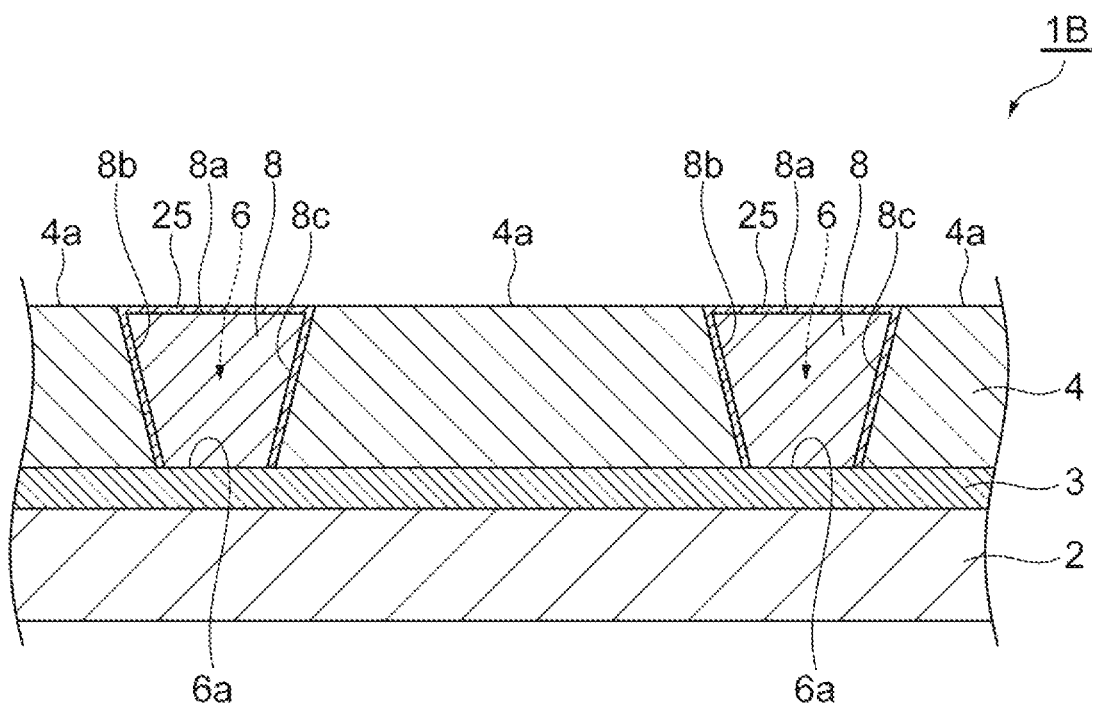
FIG. 5 is a schematic sectional view illustrating the electroconductive substrate according to one embodiment.

FIG. 5 is a schematic sectional view illustrating another embodiment of the electroconductive substrate. The electroconductive pattern layer 8 of an electroconductive substrate 1B illustrated in FIG. 5, includes a blackened surface 25 which configures a portion including the surface 8a on a side opposite to the bottom surface 6a of the trench 6 (hereinafter, also referred to as an upper surface 8a of the electroconductive pattern layer), and lateral surfaces 8b and 8c, in the surfaces. In the blackened surface 25, "blacken" indicates that a surface is processed such that a normal reflectance with respect to light incident on the surface of the blackened surface 25, is reduced.

The blackened surface 25 may be black metal plating which is formed by using a plating liquid for black metal plating, or may be black metal plating which is formed by a Raydent Treatment (Registered Trademark). In general, the blackened surface 25 is disposed as the electroconductive layer configuring a part of the electroconductive pattern layer 8.

Examples of the black metal plating which is formed by the plating liquid for the black metal plating, include black nickel plating, black chromium plating, black chromate of zinc plating, black rhodium plating, black ruthenium plating, alloy plating of tin-nickel-copper, alloy plating of tin-nickel, and substituted palladium plating.

The blackened surface 25 may be formed by a method of roughening the surface of the electroconductive pattern layer 8. In this case, surface roughness Ra of the blackened surface 25 is preferably greater than or equal to 15 nm, is more preferably greater than or equal to 20 nm, and is even more preferably greater than or equal to 30 nm, and is preferably less than or equal to 60 nm, is more preferably less than or equal to 55 nm, and is even more preferably less than or equal to 50 nm. Ra can be measured by a scanning probe microscope (SPM). The roughening is performed by a method of roughening the surface of the electroconductive pattern layer 8 according to an acid treatment or the like, a method of forming the electroconductive pattern layer 8 such that the surface of the electroconductive pattern layer 8 is roughened, or the like.

The thickness of the blackened surface 25 (a film of the black metal plating), may be greater than or equal to 10 nm, may be greater than or equal to 30 nm, or may be greater than or equal to 50 nm, and may be less than or equal to 150 nm, may be less than or equal to 125 nm, or may be less than or equal to 100 nm.

The blackened surface 25 configuring the surface 8a on the side opposite to the bottom surface 6a of the trench 6, for example, can be formed by forming the black metal plating covering the surface 8a after the electroconductive pattern layer 8 is formed. In a case where the gap is formed between the lateral surfaces 8b and 8c of the electroconductive pattern layer 8 and the lateral surface of the trench 6, there are many cases where the black metal plating covering not only the surface 8a of the electroconductive pattern layer 8 on the side opposite to the bottom surface 6a of the trench 6, but also the lateral surfaces 8b and 8c of the electroconductive pattern layer 8, is formed by being dipped in the plating liquid for the black metal plating.

The blackened surface 25 may be disposed as a layer configuring a surface of the electroconductive pattern layer 8 on the bottom surface 6a side of the trench 6. A blackened surface configuring the surface of the electroconductive pattern layer 8 on the bottom surface 6a side of the trench 6, for example, may be formed on the foundation layer 3 by using the black metal plating (for example, black nickel plating) as the seed layer, after the trench 6 is formed.

The electroconductive substrate may further include a protective film covering at least a part of the surface of the trench formation layer 4 and the electroconductive pattern layer 8 on a side opposite to the base material 2. The protective film, for example, may contain a resin and a filler. Examples of the resin of the protective film, include an amino resin, an isocyanate resin, a silicon resin, an acrylic resin, a polycarbonate resin, a fluorine resin, and an ultraviolet ray curable resin having an unsaturated double bond, or a functional group causing a polymerization reaction by an ultraviolet ray, such as cyclic ether and vinyl ether, and the like. Examples of the filler of the protective film, include silicon oxide, zirconium oxide, titanium oxide, aluminum oxide, magnesium fluoride zinc oxide, antimony oxide, phosphorus doped tin oxide, antimony doped tin oxide, tin doped indium oxide, Ag nano-colloid, and the like. For example, a resin composition for forming the protective film is applied onto the surface of the trench formation layer 4 and the electroconductive pattern layer 8 on the side opposite to the base material 2, and the coated film is dried and/or cured, as necessary, and thus, the protective film can be formed. In a case where the gap is formed between the electroconductive pattern layer 8 and the lateral surfaces 6b and 6c of the trench 6, the protective film may fill the gap.

The thickness of the protective film, may be greater than or equal to 10 nm, may be greater than or equal to 50 nm, or may be greater than or equal to 100 nm, and may be less than or equal to 5000 nm, may be less than or equal to 3000 nm, or may be less than or equal to 1000 nm.

A refractive index of the protective film, may be greater than or equal to 1.0, or may be greater than or equal to 1.3, and may be less than or equal to 1.6, or may be less than or equal to 1.5, from the viewpoint of the transparency of the electroconductive substrate. It is preferable that the refractive index of the protective film is less than the refractive index of the trench formation layer 4. The refractive index of the protective film, for example, can be adjusted by increasing and decreasing the content of the filler.

[Display Device]

A light emitting element is mounted on the electroconductive substrate described above, and thus, it is possible to producing a display device including the electroconductive substrate and the light emitting element. In the electroconductive substrate described above, the electroconductive pattern layer is prevented from being peeled off from the foundation layer, and thus, the display device including such an electroconductive substrate is produced to be thin like cloth or paper, and can be used as a flexible display device (display) which is capable of being folded or rolled. Such a flexible display device can be reduced in the size and the weight, and the storability and the designability thereof can be improved.

Figure 6A:
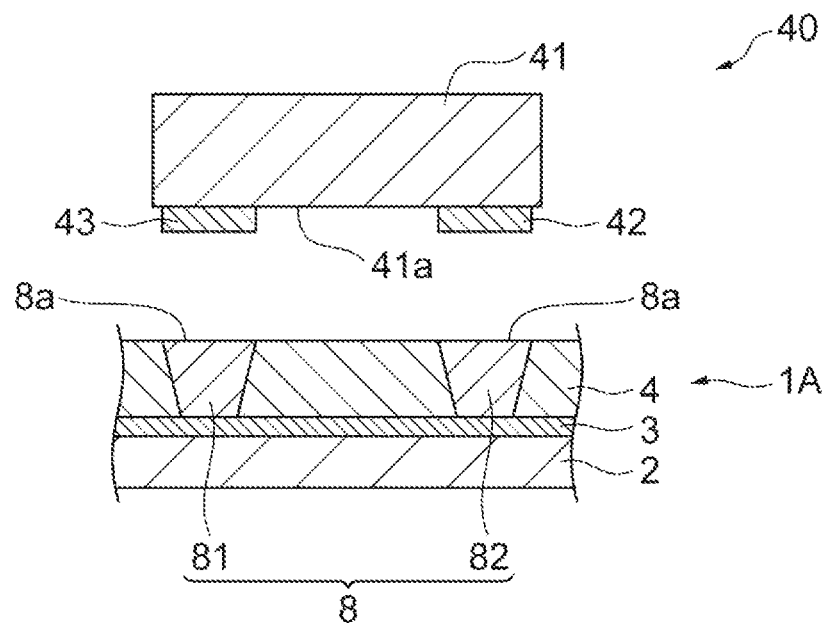
FIGS. 6A and 6B are sectional views schematically illustrating one embodiment of a method of producing a display device.
Figure 6B:
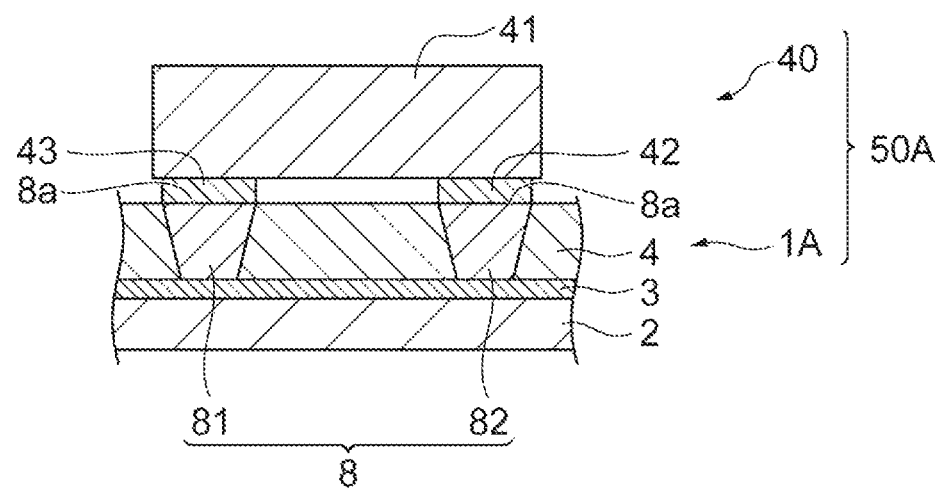

FIGS. 6A and 6B are sectional views schematically illustrating one embodiment of a method of producing the display device. In this method, first, as illustrated in FIG. 6A, a light emitting element 40 and the electroconductive substrate 1A are prepared. The light emitting element 40 includes a light emitting unit 41, a positive electrode 42 disposed on one main surface 41a of the light emitting unit 41, and a negative electrode 43 disposed on the main surface 41a with a space from the positive electrode 42. Hereinafter, the positive electrode 42 and the negative electrode 43 may be collectively referred to as electrodes 42 and 43. The light emitting element 40 may be an element which is capable of emitting red light, green light, or blue light. The light emitting element 40, for example, may be a light emitting diode (LED). In this embodiment, the electroconductive pattern layer 8 of the electroconductive substrate 1A, includes a plurality of linear portions 81 and 82 extending along a certain direction.

The shape of the light emitting element 40 (the shape of the light emitting unit 41) is not particularly limited, and for example, may be an approximately quadrangular shape (a rectangular shape, a square shape, and the like). The dimension of the light emitting element 40 may be suitably set, and in a case where the light emitting element 40 has a quadrangular shape, it is preferable that the width of the light emitting element 40, is less than or equal to 100 μm, is less than or equal to 80 μm, is less than or equal to 60 μm, is less than or equal to 30 μm, or is less than or equal to 20 μm, from the viewpoint of further improving the resolution of the display device. In this case, it is preferable that the length of the light emitting element 40, is less than or equal to 50 μm, is less than or equal to 40 μm, is less than or equal to 30 μm, is less than or equal to 20 μm, or is less than or equal to 10 μm. The width of the light emitting element 40, may be greater than or equal to 5 μm, may be greater than or equal to 10 μm, or may be greater than or equal to 20 μm. In this case, the length of the light emitting element 40, may be greater than or equal to 5 μm, or may be greater than or equal to 10 μm. When the light emitting element 40 is mounted on the electroconductive substrate 1A in a step described below, the width of the light emitting element 40 is set as a direction corresponding to the width of the electroconductive pattern layer 8. The length of the light emitting element 40 is set as a direction along the extending direction of the electroconductive pattern layer 8.

Next, as illustrated in FIG. 6B, the light emitting element 40 is mounted on the electroconductive substrate 1A. Such a step includes connecting the electrodes 42 and 43 of the light emitting element 40 to the electroconductive pattern layer 8 of the electroconductive substrate 1A. At this time, the positive electrode 42 and the negative electrode 43 of the light emitting element 40 are respectively connected to two adjacent linear portions 81 and 82 of the electroconductive pattern layer 8, and thus, the light emitting element 40 is electrically connected to the electroconductive pattern layer 8. Accordingly, it is possible to obtain a display device 50A in which the light emitting element 40 is mounted on the electroconductive substrate 1A.

Figure 7A:
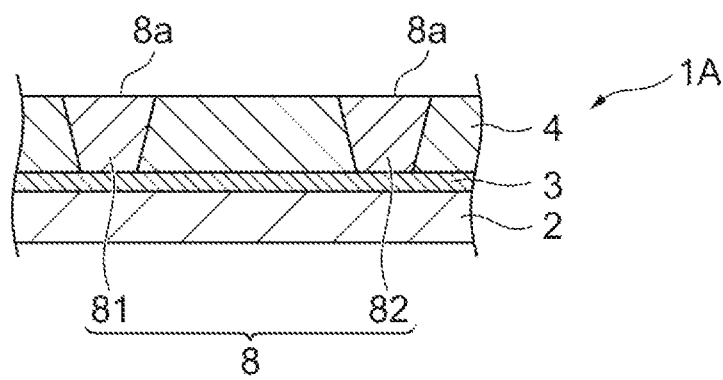
FIGS. 7A to 7C are sectional views schematically illustrating another embodiment of the method of producing the display device.
Figure 7B:
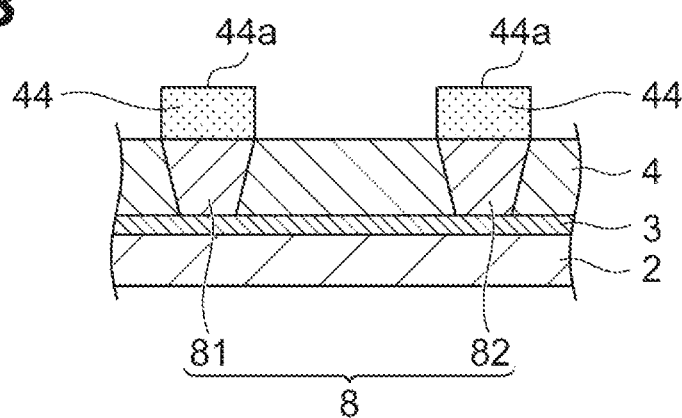
Figure 7C:
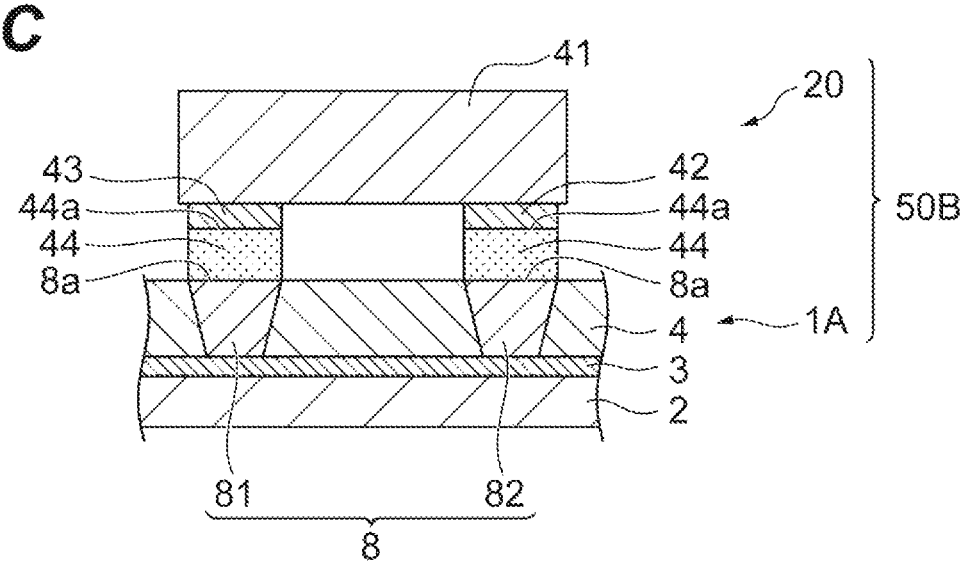

FIGS. 7A to 7C are sectional views schematically illustrating another embodiment of the method of producing the display device. Such a method is different from the method of the embodiment described above, in that the step of mounting the light emitting element 40 on the electroconductive substrate 1A, includes forming a connection portion on the electroconductive pattern layer 8 of the electroconductive substrate 1A, and connecting the light emitting element 40 to the electroconductive pattern layer 8 through the connection portion.

In this method, first, as illustrated in FIG. 7A and FIG. 7B, a connection portion 44 is formed on the electroconductive pattern layer 8 of the electroconductive substrate 1A. The connection portion 44 may be formed to be in contact with at least a part on the upper surface 8a of the electroconductive pattern layer 8.

The connection portion 44 may be formed on the upper surface 8a of the electroconductive pattern layer 8 by using a fine ball formed of a solder alloy, or may be formed by printing a paste formed of a solder alloy. The connection portion 44 may be formed according to an electroless plating method of growing the metal plating from the electroconductive pattern layer 8. In a case where the connection portion 44 is formed according to the electroless plating method, the connection portion 44 may contain tin, silver, copper, bismuth, indium, and the like, or may contain an alloy of any two or more materials, as a configuration material. In this embodiment, it is preferable that the connection portion 44 is formed by a fine ball or a paste, formed of a solder alloy.

The dimension of the connection portion 44 may be suitably set insofar as being a size in which the electrodes 42 and 43 of the light emitting element 40 can be in contact with the connection portion 44. For example, as illustrated in FIG. 7B, the connection portion 44 may be formed such that the width thereof is identical to the width of the electroconductive pattern layer 8. The connection portion 44 may be formed such that the width thereof is smaller than the width of the electroconductive pattern layer 8, and a part of the upper surface 8a of the electroconductive pattern layer 8 may be exposed.

Next, as illustrated in FIG. 7C, the electrodes 42 and 43 of the light emitting element 40 are in contact with a surface 44a of the connection portion 44 on a side opposite to a surface in contact with the electroconductive pattern layer 8, and thus, the light emitting element 40 is connected to the electroconductive substrate 1A through the connection portion 44. At this time, the positive electrode 42 and the negative electrode 43 of the light emitting element 40 are brought into contact with two adjacent connection portions 44, and thus, the light emitting element 40 is electrically connected to the electroconductive substrate 1A. Accordingly, it is possible to obtain a display device 50B in which the light emitting element 40 is mounted on the electroconductive substrate 1A.

FIGS. 8A to 8F are sectional views schematically illustrating one modification example of the method of producing the display device, including connecting the light emitting element 40 to the electroconductive substrate 1A through the connection portion 44. According to this modification example, it is possible to more suitably and easily mount the light emitting element 40 on the electroconductive substrate 1A, and thus, this modification example is particularly preferably used in a case where a smaller light emitting element 40 is mounted on the electroconductive substrate 1A.

Figure 8A:
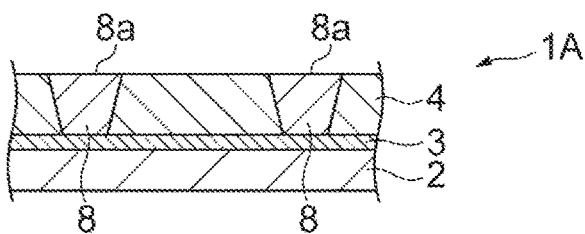
FIGS. 8A to 8F are sectional views schematically illustrating a modification example of the method illustrated in FIGS. 7A to 7C.
Figure 8B:
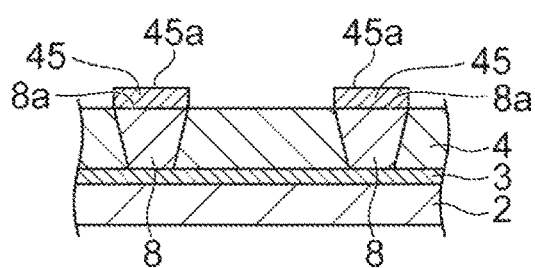

In this method, first, as illustrated in FIG. 8A and FIG. 8B, an adhesion layer 45 is formed on the electroconductive pattern layer 8 of the electroconductive substrate 1A. The adhesion layer 45 may be formed in at least a part of the upper surface 8a of the electroconductive pattern layer 8. The adhesion layer 45 is formed, and thus, when an insulating layer described below is formed on the trench formation layer 4 and the electroconductive pattern layer 8, it is possible to prevent the insulating layer from being peeled off.

It is preferable that the adhesion layer 45 is formed according to an electroless plating method of growing the metal plating from the electroconductive pattern layer 8. It is preferable that the adhesion layer 45 contains at least one type selected from nickel and a nickel alloy, as a configuration material, from the viewpoint of improving the adhesiveness with respect to a UBM layer described below, and the connection portion 44 and the light emitting element 40 disposed on the UBM layer. It is more preferable that the adhesion layer 45 contains at least one type selected from the group consisting of zinc and phosphorus, in addition to at least one type selected from the group consisting of nickel and a nickel alloy.

It is preferable that a surface 45a of the adhesion layer 45 on a side opposite to a surface in contact with the electroconductive pattern layer 8 (hereinafter, also referred to as an upper surface 45a of the adhesion layer 45) is roughened. The upper surface 45a of the adhesion layer 45 is roughened, and thus, the insulating layer more easily adheres to the upper surface 45a of the adhesion layer 45 according to an anchor effect.

A method of roughening the upper surface 45a of the adhesion layer 45, is performed by a method of roughening the upper surface 45a of the adhesion layer 45 after plating according to an acid treatment and the like, a method of forming the adhesion layer 45 after the plating liquid is adjusted such that a surface of the adhesion layer 45 is roughened, or the like.

Surface roughness Ra of the adhesion layer 45 is preferably greater than or equal to 0.1 µm, is more preferably greater than or equal to 0.3 µm, and is even more preferably greater than or equal to 0.5 µm, from the viewpoint of further improving the adhesiveness with respect to the insulating layer described below. Ra is preferably less than or equal to 1 µm, is more preferably less than or equal to 0.8 µm, and is even more preferably less than or equal to 0.7 µm, from the viewpoint of ensuring the strength of the display device. Ra can be measured by the same measurement method as the method described in the blackened surface.

The thickness of the adhesion layer 45 is preferably greater than or equal to 0.1 µm, is more preferably greater than or equal to 0.5 µm, and is even more preferably greater than or equal to 1.0 µm, from the viewpoint of obtaining suitable surface roughness Ra. The thickness of the adhesion layer 45, may be less than or equal to 2.0 µm, may be less than or equal to 1.8 µm, or may be less than or equal to 1.5 µm.

Figure 8C:
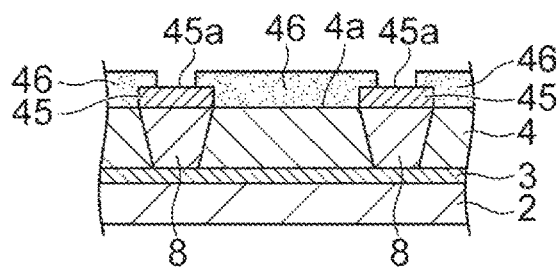

Subsequently, as illustrated in FIG. 8C, an insulating layer 46, which covers the surface 4a of the trench formation layer 4 on the side opposite to the foundation layer 3, and includes an opening portion to which the upper surface 45a of the adhesion layer 45 is exposed, is formed. It is preferable that the insulating layer 46 is formed to cover the surface 4a of the trench formation layer 4, and a part of the adhesion layer 45 (for example, an end portion of the upper surface 45a of the adhesion layer 45).

The insulating layer 46 is formed of a material having insulating properties. The material having the insulating properties may be an inorganic material or a resin. Examples of the inorganic material include a compound containing silicon, such as $SiO_2$ and SiN. Examples of the resin include an epoxy resin, polyimide, and the like.

Figure 8D:
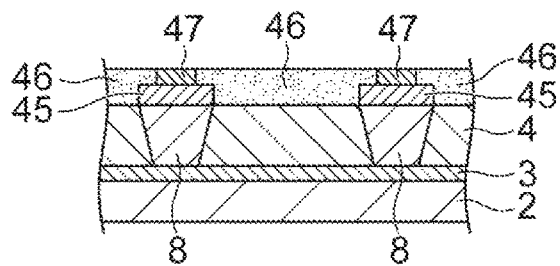

As illustrated in FIG. 8D, an UBM layer (a under-barrier metal layer) 47 is formed on the upper surface 45a of the adhesion layer 45, which is exposed into the opening portion of the insulating layer 46. It is preferable that the UBM layer 47 is formed according to an electroless plating method of growing the metal plating from the adhesion layer 45. The UBM layer 47 may contain at least type of metal selected from the group consisting of nickel, cobalt, iron, and copper. The UBM layer 47 may further contain a non-metal element such as phosphorus. It is preferable that the UBM layer 47 contains nickel, or contains nickel and phosphorus.

Figure 8E:
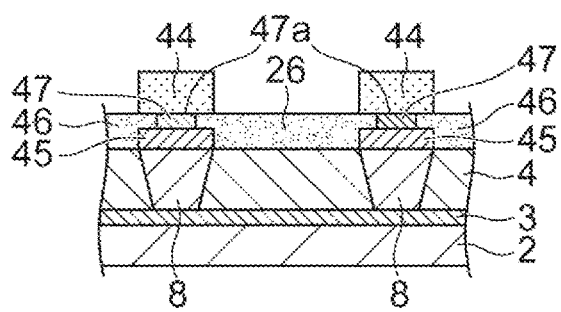

As illustrated in FIG. 8E, the connection portion 44 is formed on a surface 47a of the UBM layer 47 on a side opposite to the electroconductive substrate 1A. A configuration material and a forming method of the connection portion 44 may be identical to the configuration material and the forming method of the embodiment described above, and in this modification example, it is preferable that the connection portion 44 is formed according to an electroless plating method of growing the metal plating from the UBM layer 47, from the viewpoint of mounting a smaller light emitting element 40. It is preferable that the connection portion 44 contains tin or an alloy thereof, as a configuration material. A part of the connection portion 44 to be formed on the UBM layer 47, may be in contact with a surface of the insulating layer 46.

Figure 8F:
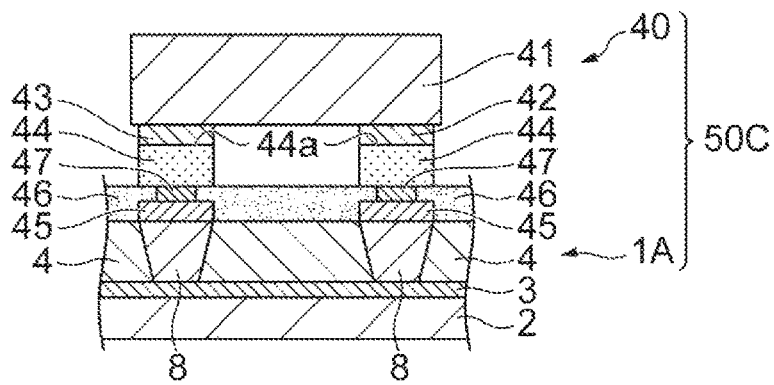

As illustrated in FIG. 8F, the light emitting element 40 is connected to the formed connection portion 44. Accordingly, it is possible to obtain a display device 50C in which the light emitting element 40 is connected to the electroconductive pattern layer 8 of the electroconductive substrate 1A through the connection portion 44, the UBM layer 47, and the adhesion layer 45. That is, the light emitting element 40 is mounted on the electroconductive substrate 1A, according to the step forming the adhesion layer 45, the insulating layer 46, the UBM layer 47, and the connection portion 44, and connecting the light emitting element 40 to the connection portion 44.

Figure 9:
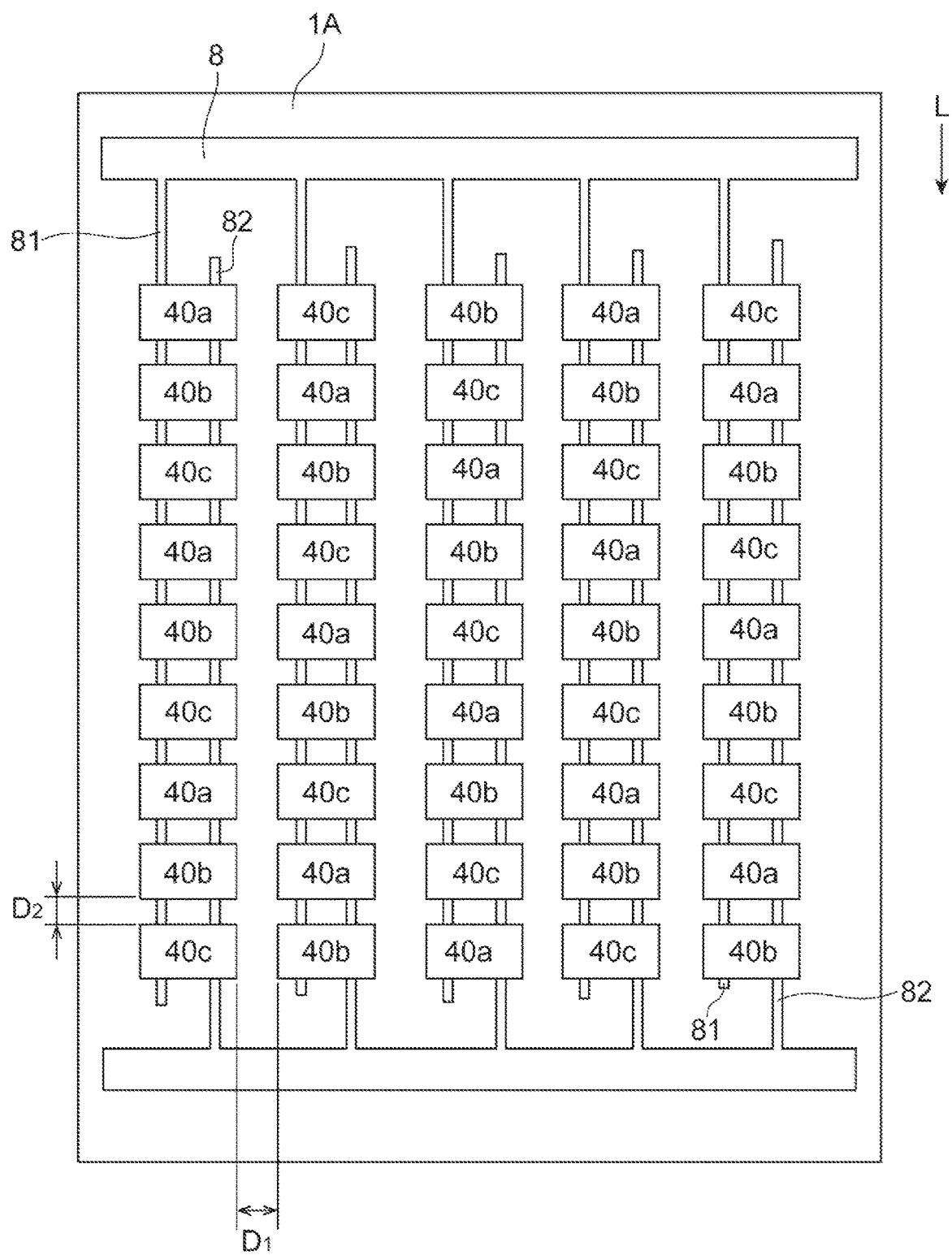
FIG. 9 is a plan view schematically illustrating a main part of the display device which is obtained according to the method illustrated in FIGS. 6A to 8F.

FIG. 9 is a plan view schematically illustrating a main part of a display device 50 (50A to 50C) which is obtained according to the method illustrated in FIGS. 6A to 8F. In the display device 5 illustrated in FIG. 9, a plurality of light emitting elements 40 (40a, 40b, and 40c) are arranged along an extending direction L of two adjacent linear portions while straddling two adjacent linear portions 81 and 82 of the electroconductive pattern layer 8 of the electroconductive substrate 1A. The light emitting element 40 may be configured of a light emitting element 40a including a red light emitting unit, a light emitting element 40b including a green light emitting unit, and a light emitting element 40c including a blue light emitting unit, and such light emitting elements 40a, 40b, and 40c may be arranged in an arbitrary order. For example, a distance $D_1$ in a width direction of the electroconductive pattern layer 8 may be less than or equal to 400 µm, and a distance $D_2$ in the extending direction L of the electroconductive pattern layer 8 may be less than or equal to 200 µm, as a distance between the adjacent light emitting elements 40 (40a, 40b, and 40c).

In the method of producing the display device 50 described above, a step of disposing a sealing portion covering an exposed portion of the light emitting element 40, may be further provided. The sealing portion, for example, may be formed of a resin such as a silicone resin, an epoxy resin, and an olefin resin.

It is also possible to mount the light emitting element on the electroconductive substrate 1B according to another embodiment, according to the same method as that of the first embodiment, and to produce the display device. In this case, the light emitting element 40 may be mounted by being connected onto the blackened surface 25 of the electroconductive substrate 1B directly or through the connection portion 44.

[Electronic Device]

In another embodiment, an electronic component other than the light emitting element can be mounted on the electroconductive substrate which is produced by the method described above. Examples of the electronic component other than the light emitting element, include a passive component such as a capacitor, an inductor, and a thermistor, a semiconductor element, a connector, and the like. Accordingly, it is possible to produce an electronic device including an electronic component on the electroconductive substrate which is produced by the method described above, in addition to the display device.

EXAMPLES

Hereinafter, the present invention will be specifically described by examples, but the present invention is not limited to the examples.

Example 1

A catalyst-containing resin for forming a foundation layer forming, containing 20 mass % of Pd particles, and an isocyanate resin, was prepared. The catalyst-containing resin was applied onto a PET film (a thickness of 100 µm), which is a transparent base material, by using a bar coater. The coated film was heated at 80° C., and was cured, and thus, the foundation layer (a thickness of 100 nm) was formed. After that, an ultraviolet ray curable transparent acryl-based oligomer was applied onto the foundation layer, by using a bar coater, and thus, a trench formation layer (a thickness of 2 µm) was formed.

An Ni mold in which a mesh-like pattern was formed and a convex portion having a width of 1 µm was provided, was prepared. The mold was pressed against the trench formation layer, and a tip end of the convex portion of the mold reached the foundation layer. In such a state, the trench formation layer was cured by being irradiated with an ultraviolet ray. Accordingly, a trench including a bottom surface to which the foundation layer was exposed, was formed. The width of the trench was 1 µm, the depth of the trench was 2 µm, and a distance between adjacent trenches was 100 µm.

A laminated body including the trench formation layer in which the trench was formed, was dipped in an alkaline degreasing liquid containing a surfactant, for 5 minutes. After that, the laminated body taken out from the degreasing liquid, was washed with pure water. The laminated body after being washed, was dipped in an electroless plating liquid containing nickel sulfate and sodium hypophosphite, for 3 minutes, and metal plating as a seed layer (a thickness of 100 nm) formed of Ni and P, was grown from the foundation layer which was exposed to the bottom surface of the trench. The laminated body taken out from the electroless plating liquid, was washed with pure water. Subsequently, the laminated body in which the seed layer was formed, was dipped in an aqueous solution containing Pd, for 5 minutes, and then, was washed with pure water, and the Pd particles as a catalyst were adsorbed in the seed layer. After that, the laminated body was dipped in an electroless plating liquid containing copper sulfate and formalin, for 5 minutes, and thus, Cu plating (an upper metal plating layer) filling the trench, was grown on the seed layer. The laminated body taken out from the electroless plating liquid, was washed with pure water, and was dried at 80° C. for 3 minutes, and a mesh-like pattern was formed, and thus, an electroconductive substrate including an electroconductive pattern layer formed of the seed layer and the Cu plating, was obtained. In the electroconductive substrate, a width W of the electroconductive pattern layer was 1 µm, the thickness of the electroconductive pattern layer was 2 µm, and an aspect ratio (Thickness/Width) of the electroconductive pattern layer was 2. A distance S between adjacent electroconductive pattern layers was 200 µm. In the obtained electroconductive substrate, a sectional surface of the electroconductive pattern layer was cut out by using a cross-section polisher, and it was confirmed that a gap was formed between a lateral surface of the trench and a lateral surface of the electroconductive pattern layer, according to observation using an electron scanning microscope.

Examples 2 to 5

An electroconductive substrate was prepared by the same method as that in Example 1, except that the width W of the electroconductive pattern layer (the width of the trench) and the thickness of the electroconductive pattern layer (the depth of the trench) was changed to the values shown in Table 1.

Examples 6 to 9

An electroconductive substrate was prepared by the same method as that in Example 1, in that the thickness of the electroconductive pattern layer (the depth of the trench) was changed to the values shown in Table 1.

Comparative Example 1

Figure 10A:
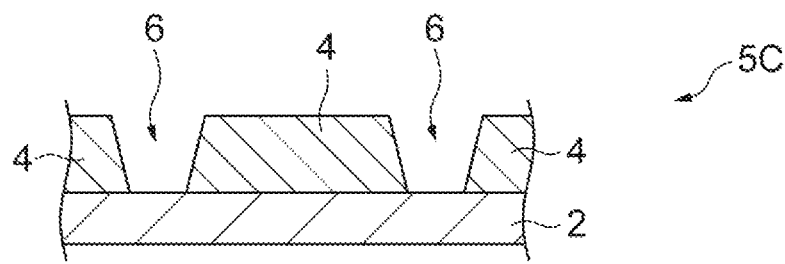
FIGS. 10A to 10D are process charts illustrating a method of producing of the electroconductive substrate of the related art.
Figure 10B:
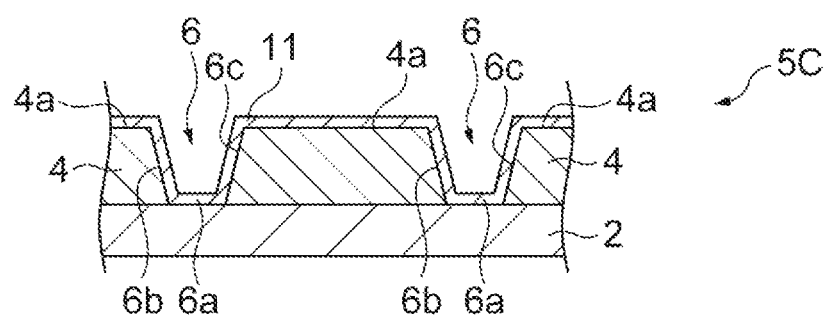
Figure 10C:
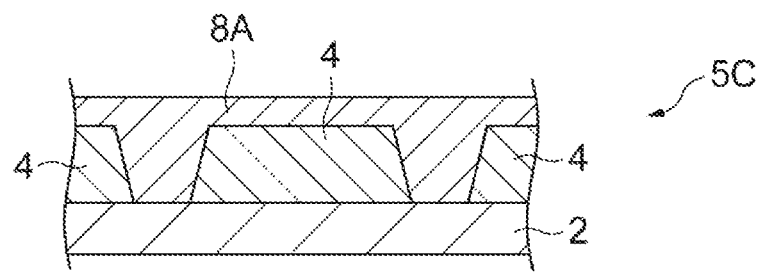
Figure 10D:
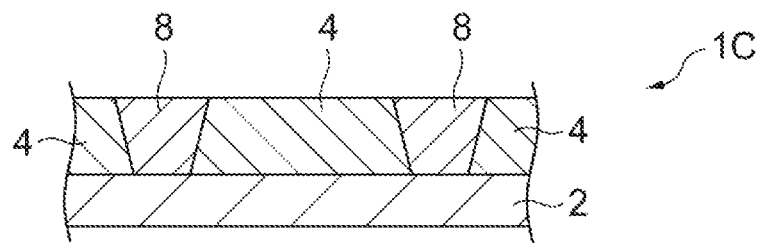

An electroconductive substrate not including the foundation layer, was prepared according to a production method of the related art illustrated in FIGS. 10A to 10D. First, an ultraviolet ray curable transparent acryl-based oligomer was applied onto the same PET film (the base material 2) as that of the examples, and the trench formation layer 4 (a thickness 2 of µm) was formed. A mold in which a mesh-like pattern was formed and a convex portion having a width of 1 µm was provided, was pressed against the trench formation layer 4, and a tip end of the convex portion reached the base material 2. In such a state, the trench formation layer 4 was cured by being irradiated with an ultraviolet ray, and thus, a laminated body 5C was obtained in which the trench 6 including the bottom surface to which the base material 2 was exposed, was formed (FIG. 10A). Next, a seed layer 11 formed of Cu, covering the entire surface of the trench formation layer 4 and the entire bottom surface 6a, was formed by a sputtering method (FIG. 10B). After that, the laminated body 5C was dipped in an electroless plating liquid containing copper sulfate and formalin, and thus, Cu plating was grown from the seed layer 11, and a Cu plating layer 8A which filled the trench 6 and covered the entire trench formation layer 4, was formed (FIG. 10C). After that, a portion of the Cu plating layer 8A, other than a portion filling the inside of the trench 6, was removed by etching (FIG. 10D), and thus, an electroconductive substrate 1C according to Comparative Example 1, including the electroconductive pattern layer 8, was prepared. In the obtained electroconductive substrate, the sectional surface of the electroconductive pattern layer was cut out by using a cross-section polisher, and it was confirmed that the electroconductive pattern layer 8 adhered to the lateral surfaces 6b and 6c of the trench 6, and a gap was not formed therebetween, according to observation using an electron scanning microscope.

In each of the electroconductive substrates, surface roughness Ra of a surface of the electroconductive pattern layer on a side opposite to the bottom surface of the trench, was measured in a visual field of 1 μm, by using a scanning probe microscope. In addition, the sectional surface (the perpendicular plane) of each of the electroconductive substrates was observed, and it was confirmed that a mixed region was formed in which particles containing nickel which is a metal configuring the seed layer of the electroconductive pattern layer, entered the foundation layer. In the mixed region, a plurality of metal particles were continuously connected from the electroconductive pattern layer. The thickness of the mixed region was measured on the basis of the observation of the perpendicular plane. In the electroconductive substrate of Comparative Example 1, the mixed region was not formed.

<Bending Test>

Figure 11:
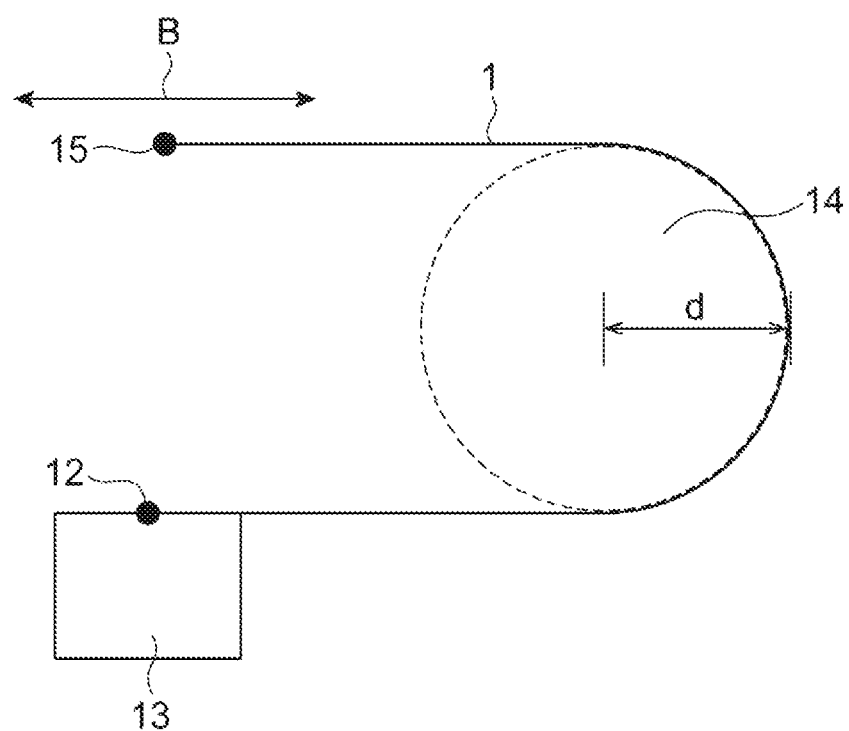
FIG. 11 is a schematic view of a bending resistance testing machine.

A sample of each electroconductive substrate having a length of 150 mm and a width of 50 mm, was prepared. The sample was subjected to a bending test according to JISC5016, using a bending resistance testing machine illustrated in FIG. 11. That is, the electroconductive substrate 1 was set to conform to a circular circumferential surface (Curvature Radius d: 5 mm) of a bent portion 14 while fixing an end portion 12 of the electroconductive substrate 1 to a fixation portion 13, and thus, the electroconductive substrate 1 was disposed to be bent. After that, an end portion 15 on a side opposite to the end portion 12 was moved back and forth along a direction illustrated by an arrow B. A movement distance that the end portion 15 was moved back and forth, was set to 30 mm, and a back and forth cycle was set to 150 times/minute, and thus, the end portion 15 was repeatedly moved back and forth for 1 minute.

<Evaluation of Electroconductivity (Measurement of Surface Resistance)>

Surface resistance of each of the electroconductive substrates before and after the bending test was measured by using a non-contact type resistance measuring instrument EC-80P (manufactured by NAPSON CORPORATION). The measurement was performed in a region of φ20 mm of a surface of the electroconductive substrate. Electroconductivity was evaluated in the following four ranks, on the basis of the measurement result. A rank A indicates that the electroconductivity is most excellent.

Rank A: The surface resistance is less than 5 Ω/square
Rank B: The surface resistance is greater than or equal to 5 Ω/square and less than 10 Ω/square
Rank C: The surface resistance is greater than or equal to 10 Ω/square and less than 15 Ω/square
Rank D: The surface resistance is greater than or equal to 15 Ω/square <Evaluation of Adhesiveness>

A sectional surface of the electroconductive substrate after the bending test, was observed with an electron scanning microscope, and the presence or absence of the peeling of the electroconductive pattern layer from the foundation layer or the base material was confirmed.

<Evaluation of Transparency>

A total light transmittance of the electroconductive substrate was measured according to JISK7136, using a haze meter NDH5000 (manufactured by NIPPON DENSHOKU INDUSTRIES CO., LTD.). The transparency of the transparent electroconductive substrate was evaluated in the following three ranks, with respect to the measurement result. A rank A indicates that the transparency is most excellent.

Rank A: Total Light Transmittance of Electroconductive Substrate/Total Light Transmittance of Base Material× 100=greater than or equal to 98%
Rank B: Total Light Transmittance of Electroconductive Substrate/Total Light Transmittance of Base Material× 100=greater than or equal to 96% and less than 98%
Rank C: Total Light Transmittance of Electroconductive Substrate/Total Light Transmittance of Base Material× 100=less than 96%

TABLE 1

| | Electroconductive pattern layer (trench) | | | | | Evaluation result | | | |
|---|---|---|---|---|---|---|---|---|---|
| | | | | | | | | After bending test | |
| | W/S (μm) | Thickness (μm) | Aspect ratio | Thickness of mixed region (nm) | Ra (nm) | Presence of absence of gap | Transparency | Electro-conductivity | Peeling (adhesiveness) | Electro-conductivity |
| Example 1 | 1/200 | 2 | 2 | 38 | 8 | Present | B | B | Absent | B |
| Example 2 | 0.3/200 | 0.6 | 2 | 38 | 8 | Present | A | C | Absent | C |
| Example 3 | 0.5/200 | 1 | 2 | 38 | 8 | Present | A | B | Absent | B |
| Example 4 | 3/200 | 6 | 2 | 38 | 8 | Present | B | A | Absent | A |
| Example 5 | 3.5/200 | 7 | 2 | 38 | 8 | Present | C | A | Absent | A |
| Example 6 | 1/200 | 4.5 | 4.5 | 38 | 8 | Present | C | A | Absent | A |
| Example 7 | 1/200 | 4 | 4 | 38 | 8 | Present | B | A | Absent | A |
| Example 8 | 1/200 | 1 | 1 | 38 | 8 | Present | B | B | Absent | B |
| Example 9 | 1/200 | 0.5 | 0.5 | 38 | 8 | Present | A | B | Absent | C |
| Comparative Example 1 | 1/200 | 2 | 2 | Absent | 8 | Absent | B | B | Present | D |

As shown in Table 1, in the electroconductive substrates of Examples 1 to 9, it was found that the electroconductive pattern layer after the bending test was prevented from being peeled off, and excellent electroconductivity was maintained.

Examples 10 to 12

A plurality of electroconductive substrates were prepared by the same method as that in Example 1. Such electroconductive substrates were dipped in an aqueous solution containing Pd, for 5 minutes, and then, were washed with pure water, and thus, the Pd particles as the catalyst were adsorbed in the surface of the electroconductive pattern layer. After that, the electroconductive substrate was dipped in an electroless plating liquid for black Ni plating, for 3 minutes, and thus, a black Ni plating film was formed as the uppermost layer of the electroconductive pattern layer on a side opposite to the bottom surface of the trench and on the lateral surface side of the trench. Each of the electroconductive substrates taken out from the electroless plating liquid, was washed with pure water. Further, the black Ni plating film was subjected to an acid treatment, surface roughness Ra of the black Ni plating film was adjusted to be 15 nm (Example 10), 58 nm (Example 11), or 65 nm (Example 12), by adjusting the time of the acid treatment. The surface roughness Ra and the thickness of the mixed region were measured by the same method as that in Examples 1 to 9.

<Evaluation of Electroconductivity and Measurement of Transmittance>

In the electroconductive substrates of Examples 10 to 12 and Example 1, the transparency and the electroconductivity were evaluated by the same method as the method described above. As shown in Table 2, it was found that when Ra was 15 nm to 60 nm, the transparency and the electroconductivity were particularly excellent.

TABLE 2

| | Electroconductive pattern layer (trench) | | | Evaluation result | |
|---|---|---|---|---|---|
| | W/S (μm) | Thickness (μm) | Thickness of mixed region (nm) | Ra (nm) | Transparency | Electroconductivity |
| Example 1 | 1/200 | 2 | 38 | 8 | B | B |
| Example 10 | 1/200 | 2 | 38 | 15 | A | B |
| Example 11 | 1/200 | 2 | 38 | 58 | A | B |
| Example 12 | 1/200 | 2 | 38 | 65 | A | C |

Examples 13 to 15

A plurality of electroconductive substrates were prepared by the same method as that in Example 1. A curable resin composition for forming a protective film was applied onto the surface of the trench formation layer and the electroconductive pattern layer of such electroconductive substrates, with a doctor blade. The coated film was dried, and then, was cured by being irradiated with an ultraviolet ray, and thus, the protective film (a thickness 100 nm) covering the trench formation layer and the electroconductive pattern, was formed. The curable resin composition for forming the protective film, used here, contains a filler (silicon oxide) and a fluorine resin. A refractive index of the protective film was adjusted to be the values shown in Table 3 by changing the content of the filler. The thickness of the mixed region was measured by the same method as that in Examples 1 to 9.

<Evaluation of Transparency>

In the electroconductive substrates of Examples 13 to 15 and Example 1, the transparency of the electroconductive substrate was measured by the same method as the method described above. The results are shown in Table 3. As shown in Table 3, it was found that in a case where the refractive index of the protective film was greater than a refractive index of the air of 1.0, and was less than the refractive index of the trench formation layer, the transparency was particularly excellent.

TABLE 3

| | Electroconductive pattern layer (trench formation layer) | | | Protective film | | Evaluation result |
|---|---|---|---|---|---|---|
| | W/S (μm) | Thickness (μm) | Refractive index of trench formation layer | Content of filler (mass %) | Refractive index | Transparency |
| Example 1 | 1/200 | 2 | 1.51 | — | (1.0) | B |
| Example 13 | 1/200 | 2 | 1.51 | 82 | 1.33 | A |
| Example 14 | 1/200 | 2 | 1.51 | 25 | 1.50 | B |
| Example 15 | 1/200 | 2 | 1.51 | 6 | 1.55 | C |

According to the present invention, it is possible to produce the electroconductive substrate in which the electroconductive pattern layer filling the trench is provided, and the peeling of the electroconductive pattern layer and a decrease in the electroconductivity due to bending are suppressed, and the electronic device using the electroconductive substrate.

Further, the present invention is also capable of providing the display device in which in the electroconductive substrate, the peeling of the electroconductive pattern layer is suppressed. Recently, a display device (for example, an LED display) including a light emitting element such as a light emitting diode (LED) has developed. In a liquid crystal display (LCD), backlight is controlled by transmissive liquid crystals, but in the LED display, a pixel is configured by using a light emitting diode which is a natural light emitting element. Accordingly, the LED display has characteristics such as a high brightness, long lifetime, and a high viewing angle.

In the display device including the light emitting element, it is preferable to decrease the size of the light emitting element itself, in order to improve the resolution. However, in a case where the size of the light emitting element decreases, it is necessary to form a fine electroconductive pattern layer, and thus, there is a tendency that the electroconductive pattern layer is easily peeled off, and the electroconductivity is difficult to be ensured. According to the present invention, it is possible to easily producing the display device in which even in a case where the size of the light emitting element decreases, the electroconductive pattern layer of the electroconductive substrate is hardly peeled off, and adhesiveness between the light emitting element and the electroconductive substrate is excellent.

1A, 1B: electroconductive substrate, 2: base material, 3: foundation layer, 4: trench formation layer, 6: trench, 6a: bottom surface of trench, 6b, 6c: lateral surface of trench, 8: electroconductive pattern layer, 8a: surface of electroconductive pattern layer on side opposite to bottom surface of trench, 8b, 8c: lateral surface of electroconductive pattern layer, 8R: metal particles, 20: mixed region, 25: blackened surface, 31: resin, 32: catalyst particles, T: thickness of mixed region, 40: light emitting element, 44: connection portion, 45: adhesion layer, 46: insulating layer, 47: UBM layer, 50: display device.

What is claimed is:

1. An electroconductive substrate comprising:
   a base material;
   a foundation layer which is disposed on the base material and contains a catalyst and a resin;
   a trench formation layer disposed on the foundation layer; and
   an electroconductive pattern layer including metal plating, wherein:
   the trench formation layer includes a trench having (1) a bottom surface that exposes the foundation layer and (2) a lateral surface which includes a surface of the trench formation layer;
   the trench is at least partially filled with the electroconductive pattern layer;
   the catalyst is dispersed in the resin, as catalyst particles;
   the foundation layer includes a mixed region (1) which extends from the electroconductive pattern layer towards the base material and (2) in which metal particles of a metal of the electroconductive pattern layer are in the foundation layer such that the mixed region includes a mixture of the metal particles, the catalyst and the resin; and
   the mixed region has a thickness that is less than a thickness of the foundation layer such that a portion of the foundation layer containing the catalyst and the resin but not the metal particles is between the mixed region and the base material.

2. The electroconductive substrate according to claim 1, wherein a ratio of the thickness of the mixed region to the thickness of the foundation layer is 0.1 to 0.9.

3. The electroconductive substrate according to claim 1, wherein:
   a width of the electroconductive pattern layer is 0.3 μm to 5.0 μm; and
   a ratio of the thickness of the electroconductive pattern layer to the width of the electroconductive pattern layer is 0.1 to 10.0.

4. The electroconductive substrate according to claim 1, wherein a gap is formed between at least a part of a lateral surface of the electroconductive pattern layer and the lateral surface of the trench.

5. The electroconductive substrate according to claim 1, wherein the surface of the electroconductive pattern layer opposite to the bottom surface of the trench is a blackened surface and the surface roughness Ra is 15 nm to 60 nm.

6. The electroconductive substrate according to claim 1, further comprising:
   a protective film covering at least a part of a surface of the trench formation layer and the electroconductive pattern layer on a side opposite to the base material,
   wherein a refractive index of the protective film is greater than 1.0, and is less than a refractive index of the trench formation layer.

7. The electroconductive substrate according to claim 1, wherein the electroconductive pattern layer forms a mesh-like pattern.

8. An electronic device, comprising:
   the electroconductive substrate according to claim 1; and
   an electronic component mounted on the electroconductive substrate.

9. The electronic device according to claim 8, further comprising:
   a connection portion disposed on the electroconductive pattern layer,
   wherein the electronic component is connected to the electroconductive substrate through the connection portion.

10. The electronic device according to claim 8, further comprising:
    an adhesion layer disposed on the electroconductive pattern layer;
    an insulating layer which (1) is disposed on the trench formation layer and the adhesion layer, (2) covers a surface of the trench formation layer on a side opposite to the foundation layer, and (3) includes an opening portion to which a part of the adhesion layer is exposed;
    a UBM layer disposed on a surface of the adhesion layer which is exposed into the opening portion of the insulating layer; and
    a connection portion disposed on the UBM layer,
    wherein the electronic component is connected to the electroconductive substrate through the connection portion, the UBM layer, and the adhesion layer.

11. A display device, comprising:
    the electroconductive substrate according to claim 1; and
    a light emitting element mounted on the electroconductive substrate.

12. The display device according to claim 11, further comprising:
    a connection portion disposed on the electroconductive pattern layer,
    wherein the light emitting element is connected to the electroconductive substrate through the connection portion.

13. The display device according to claim 11, further comprising:
    an adhesion layer disposed on the electroconductive pattern layer;
    an insulating layer which (1) is disposed on the trench formation layer and the adhesion layer, (2) covers a surface of the trench formation layer on a side opposite to the foundation layer, and (3) includes an opening portion to which a part of the adhesion layer is exposed;

a UBM layer disposed on a surface of the adhesion layer which is exposed into the opening portion of the insulating layer; and a connection portion disposed on the UBM layer, wherein the light emitting element is connected to the electroconductive substrate through the connection portion, the UBM layer, and the adhesion layer.

\* \* \* \* \*